United States Patent
Yuan et al.

(10) Patent No.: US 9,035,410 B2
(45) Date of Patent: May 19, 2015

(54) AVALANCHE PHOTODIODE DETECTOR

(75) Inventors: Ping Yuan, Van Nuys, CA (US); Joseph C. Boisvert, Thousand Oaks, CA (US); Dmitri D. Krut, Encino, CA (US); Rengarajan Sudharsanan, Stevenson Ranch, CA (US)

(73) Assignee: THE BOEING COMPANY, Chicago, IL (US)

( * ) Notice: Subject to any disclaimer, the term of this patent is extended or adjusted under 35 U.S.C. 154(b) by 1238 days.

(21) Appl. No.: 12/210,076

(22) Filed: Sep. 12, 2008

(65) Prior Publication Data

US 2009/0008738 A1 Jan. 8, 2009

Related U.S. Application Data

(62) Division of application No. 11/563,302, filed on Nov. 27, 2006, now abandoned.

(51) Int. Cl.
*H01L 31/107* (2006.01)
*B82Y 20/00* (2011.01)
*H01L 31/0352* (2006.01)

(52) U.S. Cl.
CPC .............. *H01L 31/1075* (2013.01); *B82Y 20/00* (2013.01); *H01L 31/035236* (2013.01)

(58) Field of Classification Search
CPC ............ H01L 29/66113; H01L 31/107; H01L 31/1075; H01L 31/02027
USPC ......... 257/428, 431, 432, 436, 438, 449, 466, 257/E31.032, E31.038, E31.052, E31.059, 257/E31.063, E31.064, E31.065
See application file for complete search history.

(56) References Cited

U.S. PATENT DOCUMENTS

| | | | | |
|---|---|---|---|---|
| 5,170,228 A * | 12/1992 | Sasaki | | 257/184 |
| 5,252,852 A | 10/1993 | Makiuchi et al. | | |
| 5,448,099 A * | 9/1995 | Yano | | 257/452 |
| 5,475,256 A * | 12/1995 | Sawada et al. | | 257/577 |
| 5,712,504 A * | 1/1998 | Yano et al. | | 257/452 |
| 6,005,266 A * | 12/1999 | Forrest et al. | | 257/258 |
| 6,130,441 A | 10/2000 | Bowers et al. | | |
| 7,067,853 B1 * | 6/2006 | Yao | | 257/184 |

FOREIGN PATENT DOCUMENTS

| | | |
|---|---|---|
| EP | 1294027 | 3/2003 |
| EP | 1811578 | 7/2007 |
| WO | WO 2006/046276 | 5/2006 |

OTHER PUBLICATIONS

Yuan; "Tri-Terminal Separate Absorption and Multiplication (TT-SAM) Avalanche Photodiode (ABPD) Detectors"; Feb. 7, 2006.

(Continued)

*Primary Examiner* — Jay C Kim
(74) *Attorney, Agent, or Firm* — Yee & Associates, P.C.

(57) ABSTRACT

An avalanche photodiode detector is provided. The avalanche photodiode detector comprises an absorber region having an absorption layer for receiving incident photons and generating charged carriers; and a multiplier region having a multiplication layer; wherein the multiplier region is on a mesa structure separate from the absorber region and is coupled to the absorber region by a bridge for transferring charged carriers between the absorber region and multiplier region.

17 Claims, 4 Drawing Sheets

(56) References Cited

OTHER PUBLICATIONS

Yuan; "Tri-Terminal Separate Absorption and Multiplication (TT-SAM) Avalanche Photodiode (ABPD) Detectors (Response to USARO BAA W911NF-06-R-0010 for Quantum Enabling Technologies"; Aug. 30, 2006.

Partial Search Report on corresponding PCT application (PCT/US2007/023815) from International Searching Authority (EPO) mailed Jun. 6, 2008.

Kang et al,: "Dark Current Reduction in Fused InGaAs/Si Avalanche Photodiode"; LEOS 2001, 14th. Annual Meeting of the IEEE Lasers & Electro-Optics Society. San Diego, CA, Nov. 11-15, 2001; [Annual Meeting of the IEEE Lasers and Electro-Optics Society], New York, NY: IEEE, US, vol. 2, Nov. 14, 2001, pp. 772-773, XP010566678.

Kang et al,; "Fused InGaAs-Si Avalanche Photodiodes with Low-Noise Performances"; IEEE Photonics Technology Letters, IEEE Service Center, Piscataway, NJ, US, vol. 14, No. 11, Nov. 1, 2002, pp. 1593-1595, XP011067386.

Kito et la.; "High-Speed Flip-Chip InP/InGaAs Avalanche Photodiodes with Ultralow Capacitance and Large Gain-Bandwidth Products"; IEEE Photonics Technology Letters, IEEE Service Center, Piscataway, NJ, US, vol. 3, No. 12, Dec. 1, 1991, pp. 1115-1116, XP000243979.

\* cited by examiner

AVALANCHE PHOTODIODE DETECTOR

CROSS-REFERENCE TO RELATED APPLICATIONS

This application is a divisional of application Ser. No. 11/563,302, filed on Nov. 27, 2006 now abandoned, the entire contents of which are hereby incorporated by reference.

BACKGROUND

1. Technical Field

The present disclosure relates generally to photodiode detectors, and more particularly, to avalanche photodiode detectors.

2. Description of Related Art

Avalanche photodiode detectors (APDs) are photosensitive devices that detect optical power by converting an input signal (photons) to an electrical signal. The input signal is amplified by an "avalanche effect" when carriers are injected in an area with high electrical field. This occurs because multiple electron-hole pairs are created for each absorbed photon.

An APD typically comprises of a plurality of stacked layers including a multiplication layer and an absorption layer on a semiconductor substrate. The absorption layer absorbs incident photons to create electron/holes that are transferred to the multiplication layer. The multiplication layer multiplies the electrons/holes. This occurs when electron/holes have sufficient energy to create a new electron and hole. Initial carriers and newly created carriers may create additional electrons and holes (hence the name "avalanche") by repeating the multiplication process.

In a conventional APD, all layers are grown in one epitaxial growth. This may lead to some interface defects. Due to interface defects there may be some carrier traps and recombination centers, which reduce overall quantum efficiency and after pulsing performance of an APD.

Furthermore, simultaneous growth of absorption and multiplication layers does not provide flexibility in selecting different materials for these layers.

Therefore there is a need for an avalanche photodiode that overcomes the foregoing problems in conventional APDs.

SUMMARY

In one aspect of the present embodiments, an avalanche photodiode detector is provided. The avalanche photodiode detector comprises an absorber region having an absorption layer for receiving incident photons and generating charged carriers; and a multiplier region having a multiplication layer; wherein the multiplier region is on a mesa structure separate from the absorber region and is coupled to the absorber region by a bridge for transferring charged carriers from the absorber region to the multiplier region.

In another aspect of the present embodiments, an avalanche photodiode detector is provided. The avalanche photodiode detector comprises an absorption layer formed over a semiconductor substrate, for receiving incident photons and generating charged carriers; a contact layer formed on the absorption layer; a first P-doped layer formed on the absorption layer; a multiplication layer formed over the contact layer; a second P doped layer formed on the multiplication layer; a first contact provided on the second P-doped layer; a second contact provided on the contact layer; and a third contact provided on the substrate; wherein the voltage difference across the first contact and the second contact controls the multiplication layer, and the voltage difference between the second contact and the third contact controls the absorption layer.

In yet another aspect of the present embodiments, an avalanche photodiode detector is provided. The avalanche photodiode detector comprises an absorber region having an absorption layer for receiving incident photons and generating charged carriers; a multiplier region having a multiplication layer; wherein the multiplier region is built on a separate mesa structure, and may be of a different material than the absorber region; and is wired to the absorber region to transfer charged carriers.

This brief summary has been provided so that the nature of the embodiments may be understood quickly. A more complete understanding of the embodiments may be obtained by reference to the following detailed description of the preferred embodiments in connection with the attached drawings.

BRIEF DESCRIPTION OF THE DRAWINGS

The foregoing features and other features of the present embodiments will now be described with reference to the drawings. In the drawings, the same components have the same reference numerals. The illustrated embodiments are illustrative, but not limiting. The drawings include the following Figures.

DETAILED DESCRIPTION

In one aspect of the present embodiments, a three terminal APD structure with separate absorption and multiplication layers (also referred to as "TT-SAM APD or APD") is provided. The absorption layer and multiplication layer may be grown separately and hence are controlled independently. This allows one to select different materials for the absorption and multiplication layer. The APD of the present embodiments also provides an additional terminal. The additional terminal enables individual control of bias across an absorption (Absorber") region and a multiplication ("Multiplier") region.

To facilitate an understanding of APD structure, a general overview of a conventional APD structure will be described. The specific structural components and layers of the present embodiments will then be described with reference to the general structure of APD.

Figure 1:
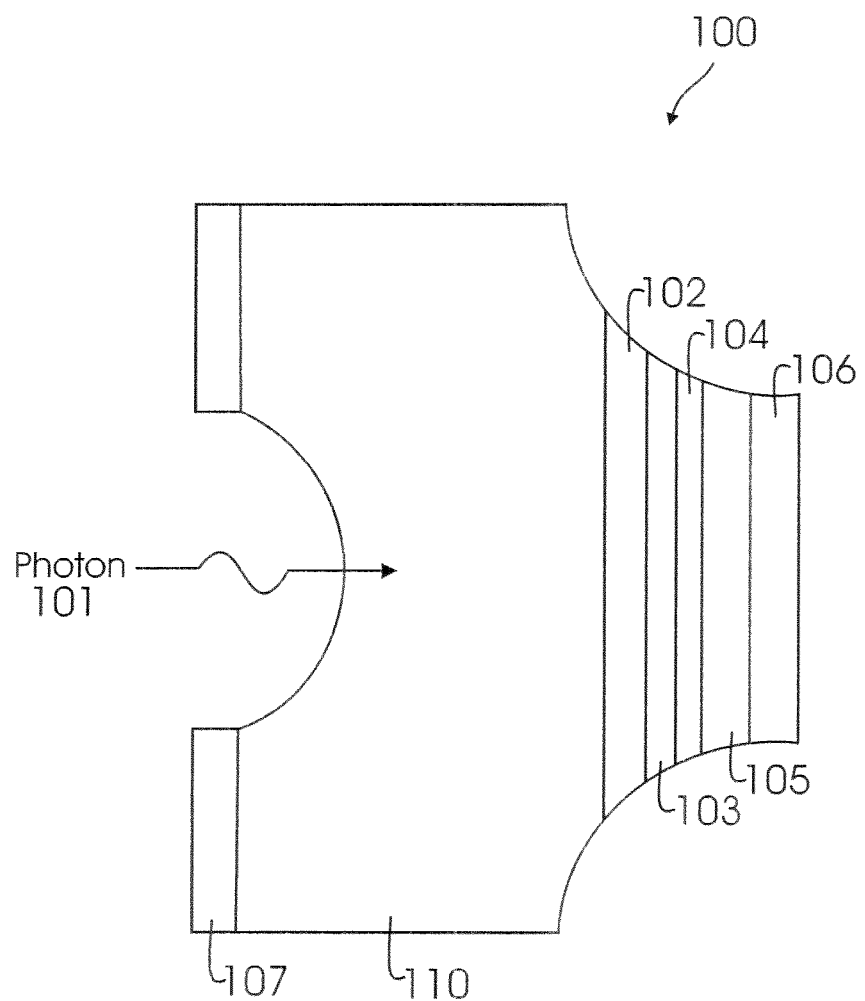
FIG. 1 shows a block diagram of an APD structure.

FIG. 1 shows a top level block diagram of a conventional APD structure. APD 100 includes a P—InP substrate layer 110; a P—InP buffer layer 102 and an N—InP multiplication layer 103; an n-InGaAsP grading (or bandgap-transition) layer and charge layer 104 of an intermediate bandgap; and an n-InGaAs narrow-bandgap absorption layer 105. Charge layer 104 is generally provided to control the electric fields in the absorption and multiplication layers, 103 and 105, respectively, and reduce charge accumulation at the interface between them. Layers 106 and 107 are metal contacts, which may be made of, for example, AuInZn or AuSn.

During operation of APD 100, incident photons 101 are absorbed in absorption layer 105, and charged carriers (holes and electrons) are created through a photogeneration process. Charged carriers are multiplied in multiplication layer 103 resulting in internal gain within APD 100. Incident photons 101 may enter APD through substrate layer 110 (as shown in FIG. 1) or through absorption layer 105.

In APD 100, electric field profile is controlled by charge layer 104. To ensure a low electric field in absorption layer 105 and a high field in multiplication layer 103, doping level in charge layer 104 needs to be precisely controlled. In practice, it is difficult to control doping level in charge layer 105. The present embodiments provide an APD structure that eliminates use of charge layer, overcoming inherent problems associates with the use of charge layer.

Figure 2A:
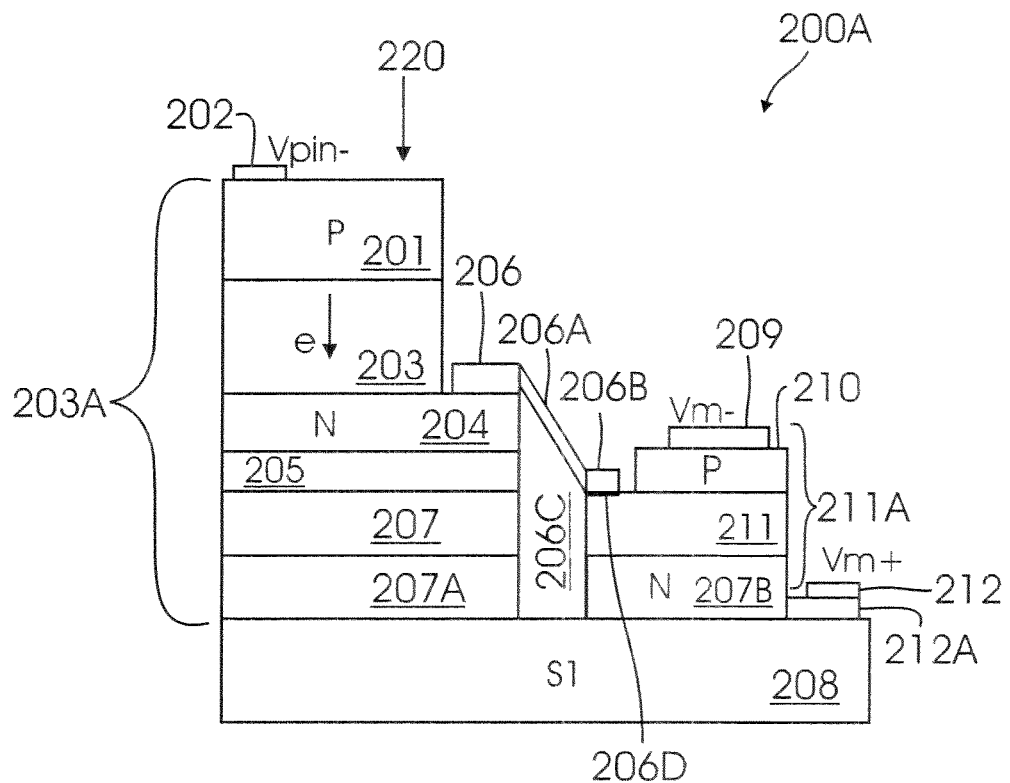
FIG. 2A shows a schematic of an APD structure on separate mesas, according to one of the present embodiments.
Figure 2B:
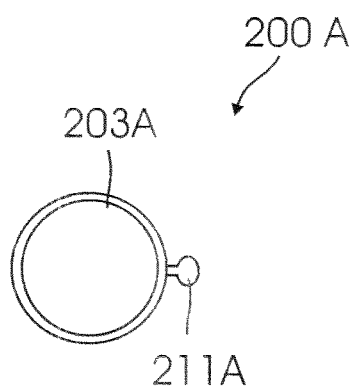
FIG. 2B shows the top view of the APD structure of FIG. 2A.

FIGS. 2A and 2B show an APD structure according to one aspect of the present embodiments. FIG. 2A is a cross-sectional view and FIG. 2B is a top view of APD structure 200.

Referring to FIG. 2A, a three terminal SAM APD structure 200A (also referred to as "TT-SAM" or "APD" interchangeably) is shown. APD 200A comprises of separate absorber region 203A and multiplier region 211A formed over a semiconductor substrate layer 208. Substrate layer 208 is preferably a semi-insulating layer. In one aspect, substrate layer 208 may be an indium phosphide (InP) layer. Absorber region 203A and multiplier region 211A may be grown in one epitaxial run or separately.

Absorber region 203A includes a first insulating layer 207A. Insulating layer 207A is formed of InAlAs and may have a thickness between 0.7 μm-1.5 μm. Above first insulating layer 207A, a second insulating layer 207 is formed. Second insulating layer 207 is formed of InAlAs and has a thickness of between 0.2 μm-1.5 μm. Above second insulating layer 207, a third insulating layer 205 is provided. This third insulating layer 205 may be formed of InP and has a thickness of about 0.2 μm to 0.5 μm.

Above third insulator layer 205, an N-doped contact layer 204 is formed. N-doped contact layer 204 is formed of a suitable material having appropriate thickness. In one aspect, N-doped contact layer 204 is formed of InP, and may have a thickness between 0.5 μm-1.0 μm.

First insulating layer 207A, second insulating layer 207 and third insulating layers 205 act as insulators and do not allow flow of charge/electrons to the substrate layer 208. This also prevents any unintentional leakage of current through N-doped contact layer 204 to the substrate layer 208.

Above contact layer 204, an absorption layer 203 is provided. Absorption layer 203 may be formed of a material having bandgap of 0.5-0.7 eV. In one aspect, absorption layer 203 is formed of InGaAs, and may have a thickness between 1-5 μm.

Above absorption layer 203, a wide bandgap window layer 201 may be provided. In one aspect, window layer 201 may be formed of InP or InGaAsP. Contacts 202 and 206 are also provided on absorber region 203A. A separate bias is applied across absorber region 203A and potential difference between contacts 202 and 206 controls absorber region 203A functionality.

Multiplier region 211A includes an N-doped layer 207B. N-doped layer 207B is preferably formed of InAlAs and has a thickness of between of 0.7 μm to 1.5 μm.

A multiplication layer 211 is grown on N-doped layer 207B. In one aspect, multiplication layer 211 comprises InAlAs. Multiplication layer 211 may have a thickness range of 0.02 μm to 1.5 μm.

It is within the scope of the present embodiments to use other suitable materials known in the art to form absorption layer 203, contact layer 204, window layer 201, multiplication layer 211, N-doped 207B, P-doped layer 210 or substrate layer 208.

Above multiplication layer 211, a P-doped InP layer 210 is grown. P-doped layer 210 may have a thickness in the range of 0.2 μm to 0.5 μm.

Contacts 209 and 212 are also provided in multiplier region 211A. Contact 212 is provided over a conducting layer 212A. Conducting layer 212A is formed over the substrate layer 208. Conducting layer 212A has a thickness of 0.35 μm to 0.75 μm.

A separate bias is applied across multiplier region 211A and voltage difference between contacts 209 and 212 controls the electric field in multiplication layer 211.

Absorber region 203A and multiplier region 211A are joined by a metal contact bridge 206A via contacts 206 and 206B. Metal bridge 206A transfers charge between absorber region 203A and multiplier region 211A. A passivation layer 206C (an insulator region) may also be provided beneath the metal bridge 206A.

The bias condition of Schottky junction 206D, which is influenced by voltage difference between contacts 202 and 209, controls carrier injection from absorber region 203A to multiplier region 211A. 206 and 206B are metal contacts and may be N-metal contacts, while contacts 202 and 209 may be P-metal contacts. Metal bridge 206A and metal contacts 206 and 206B may be a formed of a connected metal having the same potential.

Incident photons 220 enter APD structure 200A via layer 201. Incident photons 220 are absorbed in absorber region 203A, and charged carriers (holes and electrons) are created through a photogeneration process. The charged earners are injected into multiplier 211A and initiate an avalanche multiplication resulting in internal gain within APD 200A.

Absorber region 203A and multiplier region 211A are decoupled and both regions have individual isolated mesas. Therefore the size and type of material for absorber region 203A and multiplier region 211A can be controlled independently.

For APD 200A, dark current, dark count rate (DCR), device capacitance and bandwidth benefit from a smaller multiplier region 211A area. A larger absorber region 203A area with low electric field collects photons efficiently without significant sacrifice in all these aspects.

To maintain efficient carrier injection from absorber region 203A into multiplier region 211A, a Schottky junction 206D is used in contact with undoped multiplication layer 211. Schottky junction 206D is used to inject photon-generated electrons into multiplier region 211A. This junction, is adjacent to but not in the primary carrier path in the avalanche process and hence avoids recombination by holes generated by avalanching in the multiplier region 211A. The avalanche-generated holes are collected at contact 209.

APD 200A does not have a charge layer. Instead of charge layer, the carrier injection from absorber region 203A to multiplier region 211A is controlled by the bias condition of Schottky junction 206D, which is influenced by the 2-D potential distribution at the injection contact. In operation, this distribution is determined by the voltage differences between contacts 202 and 209, and 209 and 212.

Figure 2C:
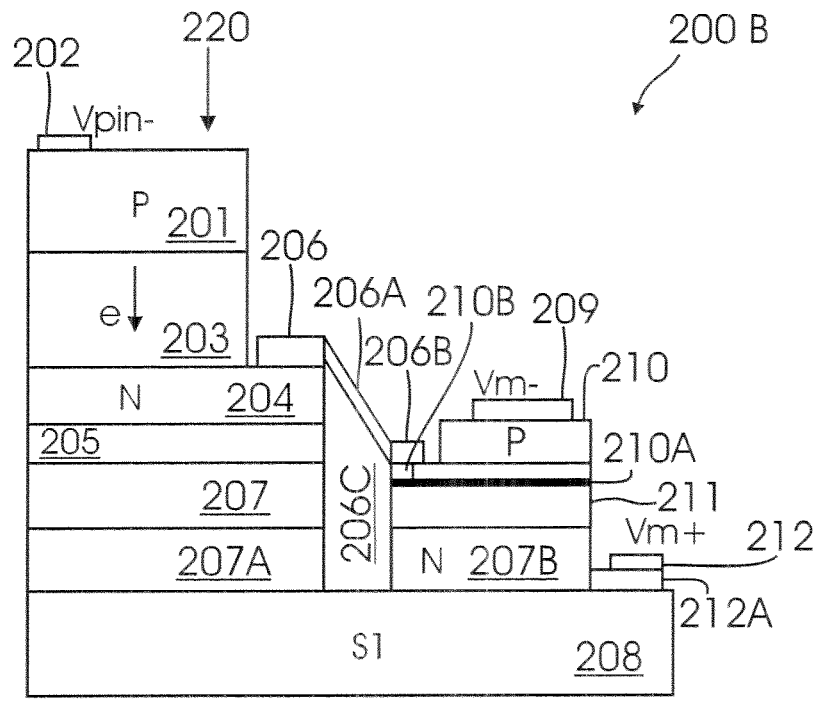
FIG. 2C shows a schematic of a APD structure with a N-Contact and quantum wells, according to one of the present embodiments.

In an alternative embodiment shown in FIG. 2C, injection efficiency of an APD 200B may further be improved with an N-well (210B) and quantum wells (210A). By replacing Schottky junction 206D with a p-n junction, leakage current from injection is minimized. 2-D electron gas formed in quantum well (210A) transports injected electrons to a high field region quickly and effectively while keeping holes from deviating from the multiplier region 211A. In the photon counting applications, because there is no hole to recombine in the beginning of a gate pulse, the injected elections will trigger the avalanche events effectively, or realize higher quantum efficiency. In one aspect of the present embodiments, quantum well 110A may have a thickness range from 50 Å-100 Å, and the N-well may be formed by diffusion or ion-implantation.

It is within the scope of present embodiments to simultaneously grow a part of absorber region and multiplier region. This simultaneously grown region may then be separated and processed independently. As shown in APD 200A and 200C, first insulating layer 207A and N-doped layer 207B are formed of InAlAs. After growing a layer of InAlAs, it is separated into at least two parts. One part, 207A, forms an insulating layer while the other part is doped to form N-doped layer 207B. Similarly, multiplication layer 211 and P-doped layer are grown simultaneously as second insulating layer 207 and third insulating layer 205.

Figure 3:
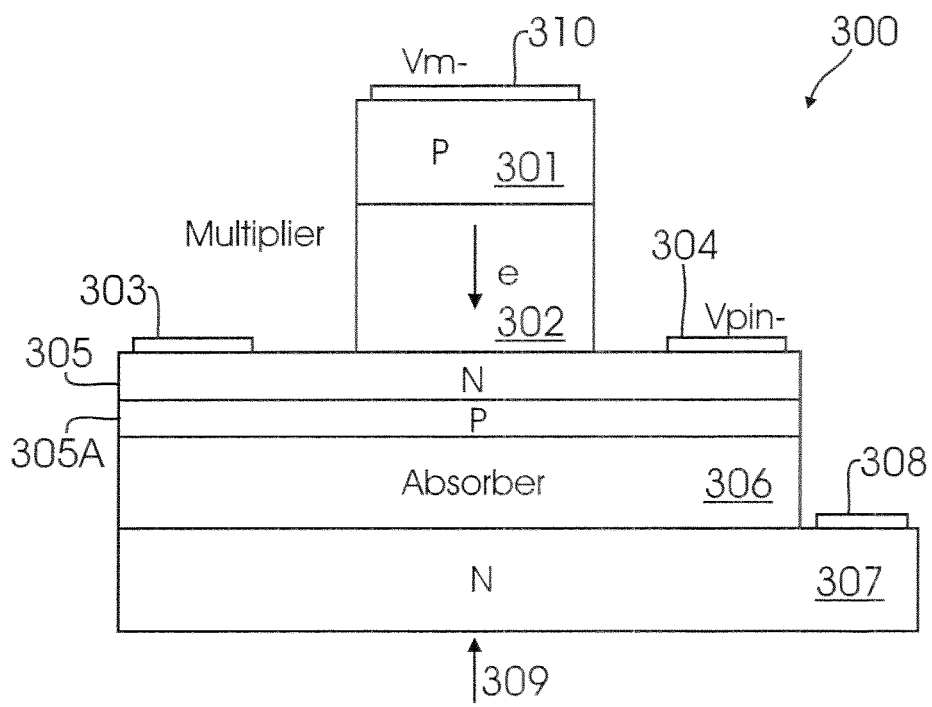
FIG. 3 shows an APD structure with single mesa, according to one of the present embodiments.

FIG. 3 shows APD 300 in another aspect of the present embodiments. APD 300 includes a single mesa structure. Substrate layer 307 is formed of a semiconductor material, for example InP. Substrate layer 307 may have a thickness range of 200 μm-500 μm. An absorption layer 306 of thickness 1 μm-5 μm is grown on substrate layer 307. Absorption layer 306 is preferably an InGaAs layer. Above absorption layer 306, a P-doped layer 305A is formed. P-doped layer 305A may have a thickness of 1 μm to 5 μm.

A N-doped layer 305 of InP is formed over P-doped layer 305A. N-doped layer 305 may have a thickness of about 0.1 μm. A multiplication layer 302 of InP or InAlAs is formed on doped layer 305. Multiplication layer 302 may have a thickness between 0.02 μm-1.0 μm. A P-layer 301 of InP is formed above multiplication layer 302 having a thickness between 0.2 μm-1.0 μm.

It is within the scope of the embodiments to use other suitable materials known in the art to form absorption layer 306, P-doped layer 305A, N-doped layer 305, multiplication layer 302 or P-layer 302.

Contact 310 is provided over P-layer 301 while N-doped layer 305 has two contacts 303 and 304. Photons 309 enter via substrate layer 307. Incident photons 309 are absorbed in absorption layer 306, and charged carriers (holes and electrons) are created through a photogeneration process. The charged carriers initiate an avalanche multiplication in multiplication layer 302 resulting in internal gain within APD 300.

In APD 300, charge is injected when electrons pass through N-doped layer 305. In order to maintain efficient carrier injection and reverse bias in the absorption layer 306 while sustaining electric field uniformity in multiplication layer 302, a tunnel junction with a p-type layer between 305 and 306 is inserted between the two function regions.

APD 300 also does not have a charge layer. Instead of charge layer, bias difference between contacts 310 and 303 controls multiplication layer 302. Similarly, voltage difference between contacts 304 and 308 controls absorption layer 306.

APD configuration 300 has a larger absorption layer 306 area coupled to a smaller multiplication mesa 302. The smaller multiplication mesa 302 reduces dark count rate while minimizing bias across absorption layer 306, thus increasing overall usable quantum efficiency of APD 300.

Figure 4:
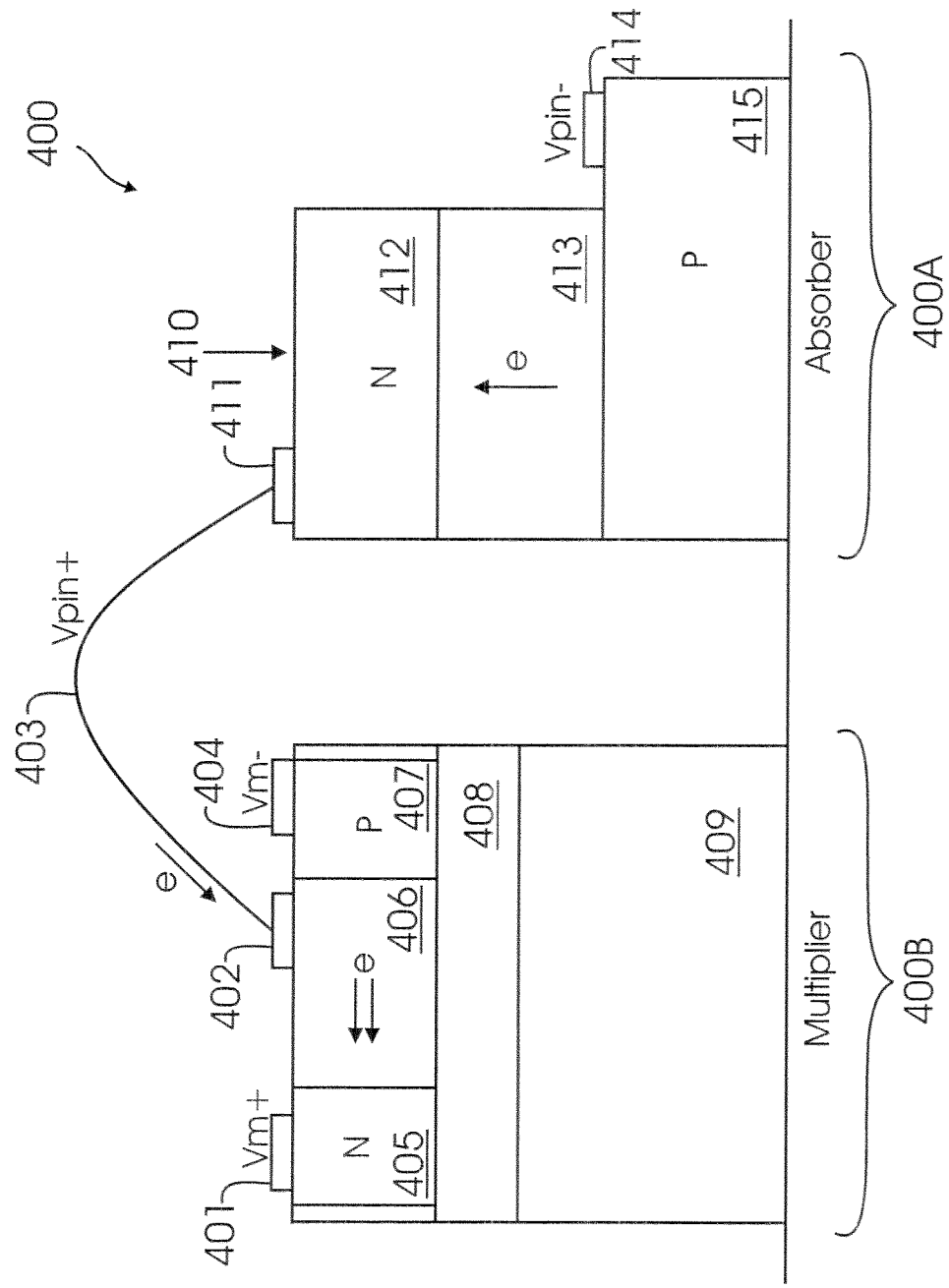
FIG. 4 shows a schematic of a hybrid APD structure, according to one of the present embodiments.

In yet another aspect of the present embodiments, a hybrid APD 400 as shown in FIG. 4, is provided. By hybrid it means that different materials having different characteristic properties may be used for forming absorber region 400A and multiplier region 400B of APD 400. Conventionally, it has been difficult to integrate Silicon material with InGaAs or InP or similar materials to form APDs. In one aspect of the present embodiments, hybrid APD 400, overcomes these material constraints.

In APD 400, different materials for multiplier region 400B and absorber region 400A are used, and wafer bonding may be used to join the different materials.

Absorber region 400A is preferably formed of InP while multiplier region 400B may be formed of Silicon. It is well known that material growth constraints exist between materials like InGaAs or InP and silicon. However, with hybrid integration, these material growth constraints between absorber and multiplier regions (400A and 400B) are avoided providing a wider spectrum of materials available for device optimization.

Absorber region 400A includes a P-doped layer 415 of InP or InAlAs of thickness range of 0.2 μm-1.0 μm. Absorption layer 413 of InGaAs is formed over P-doped layer 415. Absorption layer 413 may have a thickness range of 0.2 μm-0.5 μm.

An N-doped layer 412 of InP, InAlAs or InGaAsP is formed over absorption layer 413. N-doped layer 412 may have a thickness range of 0.2 μm-0.5 μm. Contacts 411 and 414 control the bias across absorption layer.

Multiplier region 400B includes a silicon substrate layer 409. An insulator layer 408 of silicon oxide is formed over silicon substrate layer 409. Above insulator layer 408, there is N-well region (405) and P-well region (407). A multiplication layer 406 is provided between N-well region (405) and P-well region (406) for transferring high field from N-well to P-well.

Absorber region 400A is wire bound (403) to a multiplier region 400B via metal contacts 402 and 411. Schottky junction 402 is employed to improve injection efficiency for photon-generated carriers. In order to avoid recombination with avalanche-generated holes, Schottky junction 402 avoids mainstream avalanche current, while a small potential difference between Vpin+ (404) and Vm− (401) helps to inject electrons.

Voltage difference between contacts 401 and 404 determines bias for multiplier region 400B while voltage difference between contacts 411 and 414 determines bias for absorber region 400A.

Incident photons 410 enter absorber region 400A through N-doped layer 412. Incident photons 410 are absorbed in the absorber region 400A, and charged carriers (holes and electrons) are created through a photogeneration process. The charged carriers are injected through the Schottky junction (402) and initiate an avalanche multiplication in multiplier region 400B resulting in internal gain within APD 400.

APD 400 eliminates charge layer and interface defects associates with the use of charge layer. APD 400 also allows one to select different types of materials for multiplier region 400B and absorber region 400A The foregoing APDs (200A, 200B, 300 and 400) of the present embodiments provide better quantum efficiency. APDs of the present embodiments eliminate use of charge layer between absorption layer and multiplication layer by introducing an extra terminal between absorber region (203A or 400A) and multiplier region (211A or 400B). The electric fields in absorber (203A or 400A) and multiplier regions (211A or 400B) are controlled individually by the potential differences between the three terminals. The decoupling of the two functional regions, multiplier region and absorber region, helps in maintaining a low but sufficient field in the absorber. This also allows one to independently optimize the size, material and layer structure of the two regions.

While the adaptive aspects of the present embodiments list specific materials with specific thickness for forming absorption layer, multiplication layer, contact layer, P-doped layer and N-doped layer, it will be understood by those skilled in the art that similar materials, exhibiting similar properties of varying thickness may be used, and equivalents may be substituted for elements thereof without departing from the true scope of the adaptive aspects of the present embodiments.

What is claimed is:

1. An avalanche photodiode detector, comprising:
an absorber region having an absorption layer for receiving incident photons and generating charged carriers, the absorber region comprising a first insulating layer positioned on a substrate, the first insulating layer comprising InAlAs, a second insulating layer positioned above the first insulating layer, the second insulating layer comprising InAlAs, a third insulating layer positioned above the second insulating layer, the third insulating layer comprising InP, an N-doped contact layer positioned above the third insulating layer, the absorption layer positioned above the N-doped contact layer, the absorption layer comprising InGaAs, and a wide band gap window layer positioned above the absorption layer, the wide bandgap window layer comprising InP or InGaAsP;
a first pair of contacts positioned on the wide band gap window layer and the N-doped contact layer of the absorber region to control a bias across the absorber region;
a multiplier region comprising an N-doped layer comprising InAlAs positioned on the substrate, a multiplication layer positioned on the N-doped layer, the multiplication layer comprising InAlAs, and a P-doped layer comprising InP positioned on the multiplication layer;
a second pair of contacts positioned on the P-doped layer of the multiplier region and the substrate to control a bias across the multiplier region; and
a metal contact bridge between the N-doped contact layer of the absorber region and the multiplication layer of the multiplier region, the bridge transferring the charged carriers from the absorber region to the multiplier region;
wherein the multiplier region is built on a separate mesa structure from the absorber region.

2. The avalanche photodiode detector of claim 1, further comprising a Schottky junction positioned at an interface between a contact positioned on the multiplication layer and the multiplication layer, for injecting the charged carriers into the multiplication layer.

3. The avalanche photodiode detector of claim 1, wherein a separate bias is maintained across the first pair of contacts and the second pair of contacts.

4. The avalanche photodiode detector of claim 1, wherein the absorber region and the multiplier region are decoupled and each region is positioned on a separate, isolated mesa without the metal contact bridge.

5. The avalanche photodiode detector of claim 2, wherein a bias condition in the Schottky junction is affected by a voltage difference between the N-doped contact layer of the absorber region and the P-doped layer.

6. The avalanche photodiode detector of claim 5, wherein the Schottky junction is adjacent to but not in a primary carrier path in an avalanche process.

7. The avalanche photodiode detector of claim 1, wherein a thickness of the N-doped contact layer is between 0.7 μm and 1.5 μm.

8. The avalanche photodiode detector of claim 1, wherein a contact in the first pair of contacts and the metal contact bridge are connected to the N-doped contact layer of the absorber region.

9. An avalanche photodiode detector, comprising:
an absorber region having an absorption layer for receiving incident photons and generating charged carriers; and
a multiplier region having a multiplication layer;
wherein the multiplier region is built on a separate mesa structure from the absorber region and is of a different material than the absorber region;
the absorber region comprising a first insulating layer positioned on a substrate, the first insulating layer comprising InAlAs, a second insulating layer positioned above the first insulating layer, the second insulating layer comprising InAlAs, a third insulating layer positioned above the second insulating layer, the third insulating layer comprising InP, an N-doped contact layer positioned on the substrate, an absorption layer positioned above the N-doped contact layer, the absorption layer comprising InGaAs, a wide bandgap window layer positioned above the absorption layer, the wide bandgap window layer comprising InP or InGaAsP;
the multiplier region comprising an N-doped layer comprising InAlAs, the N-doped layer positioned on the substrate, the multiplication layer positioned above the N-doped layer, the multiplication layer comprising InAlAs, a P-doped layer comprising InP positioned above the N-doped layer;
a first pair of contacts that maintain a bias across the absorber region;
a second pair of contacts that maintain a bias across the multiplier region; and
a metal contact bridge connecting the N-doped contact layer of the absorber region and the multiplication layer of the multiplier region.

10. The avalanche photodiode detector of claim 9, further comprising a Schottky junction for injecting the charged carriers into the multiplication layer.

11. The avalanche photodiode detector of claim 9, wherein a separate bias is maintained across the first pair of contacts and the second pair of contacts.

12. The avalanche photodiode detector of claim 9, wherein the absorber region and the multiplier region are decoupled and each region is positioned on a separate, isolated mesa without the metal contact bridge.

13. The avalanche photodiode detector of claim 10, wherein the Schottky junction is used in contact with the multiplication layer.

14. The avalanche photodiode detector of claim 13, wherein the Schottky junction is adjacent to but not in a primary carrier path in an avalanche process.

15. The avalanche photodiode detector of claim 9, wherein the multiplier region is of the different material than the absorber region, and further wherein the multiplier region is connected by the metal contact bridge to the absorber region for transferring the charged carriers from the absorber region to the multiplier region.

16. An avalanche photodiode detector, comprising:
an absorber region comprising, a first insulating layer positioned on a substrate, the first insulating layer comprising InAlAs and being between 0.7 and 1.5 μm thick, a second insulating layer positioned above the first insulating layer, the second insulating layer comprising InAlAs and being between 0.2 and 1.5 µm thick, a third insulating layer positioned above the second insulating layer, the third insulating layer comprising InP and being between 0.2 and 0.5 µm thick, an N-doped contact layer positioned above the third insulating layer, the N-doped contact layer comprising InP and being between 0.5 and 1.0 µm thick, an absorption layer positioned above the N-doped contact layer, the absorption layer comprising InGaAs and being between 1.0 and 5.0 µm thick, a wide bandgap window layer positioned above the absorption layer, the wide bandgap window layer comprising InP or InGaAsP;

a first pair of contacts positioned on the wide bandgap window layer and the N-doped contact layer for controlling a bias in the absorber region;

a multiplier region comprising an N-doped contact layer positioned on the substrate, the N-doped contact layer comprising InAlAs and being between 0.7 and 1.5 µm thick, a multiplication layer positioned above the N-doped contact layer, the multiplication layer comprising InAlAs and being between 0.02 and 1.5 µm thick, a P-doped layer comprising InP positioned above the N-doped contact layer, the P-doped layer being between 0.2 and 0.5 µm thick;

a second pair of contacts positioned on the P-doped layer and the substrate for controlling a bias in the multiplier region;

wherein the multiplier region is built on a separate mesa structure from the absorber region; and a metal contact bridge connecting the N-doped contact layer of the absorber region and the multiplication layer of the multiplier region and configured to transfer charged carriers from the absorber region to the multiplier region, and wherein a contact in the first pair of contacts and the metal contact bridge are connected to the N-doped contact layer of the absorber region.

17. The avalanche photodiode detector of claim 16, further comprising a Schottky junction positioned at an interface between a contact positioned on the multiplication layer and the multiplication layer for injecting the charged carriers into the multiplication layer, and wherein the Schottky junction is positioned adjacent to but not in a primary carrier path in an avalanche process of the multiplication layer.

* * * * *